(12) United States Patent
Cheng et al.

(10) Patent No.: US 7,547,608 B2
(45) Date of Patent: Jun. 16, 2009

(54) POLYSILICON HARD MASK FOR ENHANCED ALIGNMENT SIGNAL

(75) Inventors: Kangguo Cheng, Beacon, NY (US); Johnathan E. Faltermeier, LaGrangeville, NY (US); James P. Norum, Holmes, NY (US)

(73) Assignee: International Business Machines Corporation, Armonk, NY (US)

( * ) Notice: Subject to any disclaimer, the term of this patent is extended or adjusted under 35 U.S.C. 154(b) by 412 days.

(21) Appl. No.: 11/382,540

(22) Filed: May 10, 2006

(65) Prior Publication Data

US 2007/0262475 A1  Nov. 15, 2007

(51) Int. Cl.
*H01L 21/76* (2006.01)
*H01L 23/544* (2006.01)

(52) U.S. Cl. .................. 438/401; 438/462; 438/682; 438/975; 257/431; 257/464; 257/797; 257/E21.165; 257/E21.438

(58) Field of Classification Search .................. 438/401, 438/975, 462; 257/979
See application file for complete search history.

(56) References Cited

U.S. PATENT DOCUMENTS

| | | | |
|---|---|---|---|
| 6,027,861 A | 2/2000 | Yu et al. | |
| 6,287,951 B1 | 9/2001 | Lucas et al. | |
| 6,696,365 B2 | 2/2004 | Kumar et al. | |
| 6,719,808 B1 | 4/2004 | Kim et al. | |
| 6,764,903 B1 | 7/2004 | Chan et al. | |
| 6,790,374 B1 | 9/2004 | Ho et al. | |
| 2005/0012228 A1* | 1/2005 | Hiramatsu et al. | 257/797 |
| 2007/0029614 A1* | 2/2007 | Shiota et al. | 257/347 |

FOREIGN PATENT DOCUMENTS

JP  2001176841  4/2004

* cited by examiner

*Primary Examiner*—Dao H Nguyen
(74) *Attorney, Agent, or Firm*—Steven Capella; Daryl Neff

(57) ABSTRACT

A method is provided for forming a polysilicon layer on a substrate and aligning an exposure system with an alignment feature of the substrate through the polysilicon layer. In such method, a polysilicon layer is deposited over the substrate having the alignment feature such that the polysilicon layer reaches a first temperature. The polysilicon layer is then annealed with the substrate to raise the polysilicon layer to a second temperature higher than the first temperature. A photoimageable layer is then deposited over the polysilicon layer, after which an alignment signal including light from the alignment feature is received through the annealed polysilicon layer. Using the alignment signal passing through the annealed polysilicon layer from the alignment feature, an exposure system is aligned with the substrate with improved results.

15 Claims, 2 Drawing Sheets

POLYSILICON HARD MASK FOR ENHANCED ALIGNMENT SIGNAL

BACKGROUND OF THE INVENTION

The present invention relates to the fabrication of microelectronic devices and/or other micro-scale or nano-scale devices.

Micro-scale devices include semiconductor devices such as microelectronic devices as well as micro-electromechanical and micro-biomechanical devices. For many such micro-scale devices, the sizes and shapes of features therein are determined primarily by photolithographic processing. In such processing, one or more layers of a photoimageable polymer, e.g., a photoresist (a "resist") or anti-reflective coating ("ARC"), among others, is formed to overlie a substrate. Here, the term "substrate" is used to mean an object underlying the photoimageable layer which is to be patterned in accordance therewith. Thus, the term "substrate" can apply to an object which has a monolithic structure such as a single-crystal semiconductor wafer, ceramic substrate, conductive object or dielectric object. Alternatively, the term "substrate" can also be used to refer to an object which includes a plurality of layers such as a processed wafer or portion thereof such as a chip. All of the layers of such wafer can be collectively referenced as the substrate or just some of the layers can be referenced as the "substrate."

The photoimageable layer overlying the substrate is selectively exposed according to an image cast thereon by light transmitted through a photomask and focused onto the photoimageable layer. After developing the photoimageable layer, openings exist in the layer which expose selected portions of the substrate while covering other portions of the substrate. Through these openings, subsequent processes such as etching, implanting and/or oxidation, among others, are selectively applied to the exposed portions of the substrate to pattern the features of the micro-scale devices. In this way, the patterns defined by the developed photoimageable layer, e.g., resist layer, are "transferred" to the substrate to reproduce the patterns of the resist layer again in the substrate.

However, this transfer of patterns from resist layer to substrate does not always succeed. When conditions for performing these subsequent processes are particularly harsh, the patterns in the resist layer can become eroded. For example, some anisotropic etching processes (e.g., a "reactive ion etch" or "RIE") process used to form relatively deep trenches in a substrate can severely erode photoresist and ARC layers, sometimes completely obliterating the photoresist or ARC layer. As a result, the patterns transferred to the substrate may become less sharp, deformed or even missing.

To address this erosion problem of the photoimageable resist and/or ARC layer, an intermediate layer of material having a different composition from the substrate can be disposed as a "hard mask" between the substrate and the resist/ARC layer. The character of the "hard mask" layer is such that it shows little or no erosion during the harsh processing, e.g., a vertical etch process such as RIE which is used to etch the substrate relatively deeply. Typically, a hard mask layer is formed by blanket deposition over the substrate. Thereafter, the photoimageable layer is formed thereon, then exposed and developed by photolithography. The resulting patterns in the photoimageable layer are then transferred to the hard mask layer to form hard mask patterns, by selectively etching portions of the hard mask layer that are exposed by the patterns of the photoimageable layer. Similarly, a subsequent etching process such as RIE is performed to transfer the patterns of the hard mask to the substrate by selectively etching portions of the substrate that are exposed by the patterns of the hard mask layer.

Different materials are available for use as hard mask layers. When the substrate consists essentially of silicon and/or a silicon alloy such as silicon germanium, a hard mask including silicon oxide having various compositions and/or silicon nitride can be used. For particular processes, a hard mask including or consisting essentially of a polycrystalline semiconductor such as "polysilicon" can be used. In particular processes, hard mask layers of a substrate such as include silicon oxide and/or silicon nitride can be etched in accordance with the patterns of an overlying hard mask that consists essentially of polysilicon.

One difficulty posed by the use of polysilicon as a hard mask layer is the ability to properly align a substrate with the polysilicon layer thereon with a photolithographic exposure tool. As deposited normally at a temperature of about 525 degrees Celsius, polysilicon is substantially opaque to light having certain wavelengths including wavelengths of about 5300 angstroms. These wavelengths include light that is typically used in an alignment procedure to form images of alignment features of the substrate and align the exposure tool in accordance therewith. A substantially opaque polysilicon layer disposed on the substrate between the alignment features and the exposure tool greatly increases the difficulty, if not precludes carrying out such alignment procedure.

SUMMARY OF THE INVENTION

In accordance with an embodiment of the invention, a method is provided for forming a polysilicon layer on a substrate and aligning an exposure system with an alignment feature of the substrate through the polysilicon layer. In such method, a polysilicon layer is deposited over the substrate having the alignment feature such that the polysilicon layer reaches a first temperature. The polysilicon layer is then annealed with the substrate to raise the polysilicon layer to a second temperature higher than the first temperature and thereby enhance its optical characteristics. A photoimageable layer is then deposited over the polysilicon layer and an alignment signal including light from the alignment feature is received through the enhanced polysilicon layer. Using an improved alignment signal obtained after passing through the annealed polysilicon layer from the alignment feature, an exposure system is aligned with the substrate.

DETAILED DESCRIPTION

A substrate being patterned by a photolithographic exposure system needs to be precisely aligned with the exposure system in order to properly expose a photoimageable layer overlying the substrate. To align the substrate with the exposure system, an alignment signal can be used which includes light returned from an alignment feature of the substrate. However, when the substrate includes a layer of polysilicon, such as a patternable hard mask layer overlying the alignment feature, the alignment signal can be attenuated excessively by transit through the polysilicon. In accordance with an embodiment of the invention, the polysilicon layer is annealed by heating it to a second temperature higher than a first temperature at which it is initially deposited. The annealing step improves the transmission characteristic of the polysilicon layer relative to a wavelength included in the alignment signal. After annealing the polysilicon layer, a photoimageable layer such as a photoresist layer, anti-reflective coating, etc., is then deposited over the polysilicon layer. Thereafter, during a process of aligning the substrate with a photolithographic exposure system, an alignment signal is received through the polysilicon layer, the alignment signal including light from the alignment feature of the substrate. Using the alignment signal, the photolithographic exposure system is aligned with the substrate.

Figure 1:
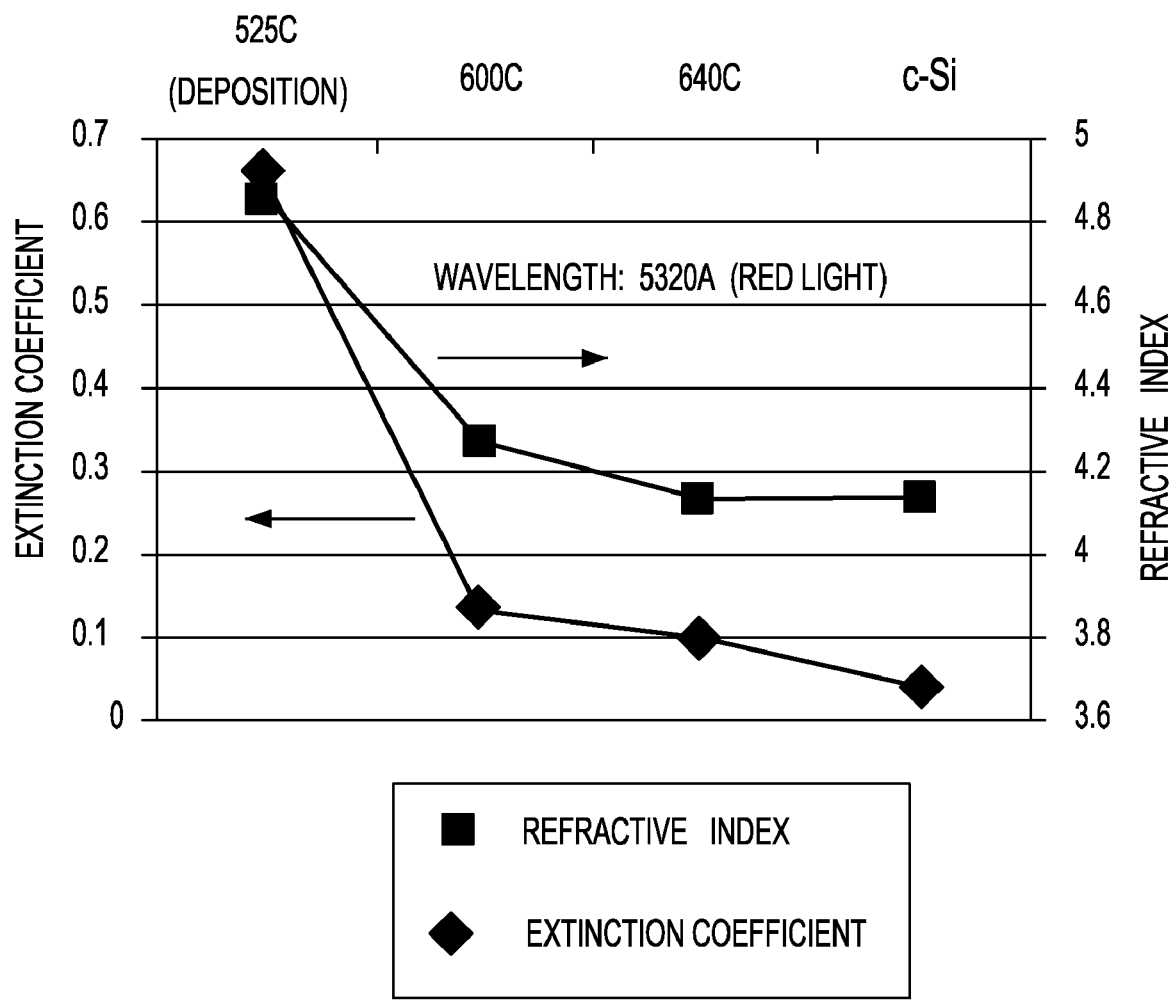
FIG. 1 is a chart plotting values of optical properties of polysilicon and single-crystal silicon relative to process temperatures.

FIG. 1 is a chart plotting optical characteristics of polycrystalline silicon or "polysilicon" in relation to temperatures at which the polysilicon has been processed. A transmission characteristic known as an "extinction coefficient" ("k"), which appears on a vertical axis on the left side of the chart, is plotted versus different temperatures at which the polysilicon is processed. Specifically, polysilicon is typically deposited at a nominal process temperature of about 525 degrees Celsius, which can be as high as 550 degrees Celsius. Data points in the chart at temperatures above 550 degrees Celsius represent temperatures at which the polysilicon layer is annealed subsequent to deposition. The "extinction coefficient" represents a degree of attenuation of the transmitted signal for a given wavelength, where a value of zero represents no attenuation and a value of 1.0 indicates complete attenuation. The data points in FIG. 1 represent values of the extinction coefficient and index of refraction for light having a nominal wavelength of 5320 angstroms. As evident from the information shown in FIG. 1, the extinction coefficient decreases as the temperature at which the polysilicon is processed increases. Stated another, the degree of signal transmission at the wavelength of interest, i.e., optical transmissivity, increases when the polysilicon is processed at a higher temperature.

Also plotted in FIG. 1 are values of an index of refraction of the polysilicon. The index of refraction, which appears on another vertical axis on the right side of the chart is plotted versus the different temperatures at which the polysilicon is processed. As evident from the information shown in FIG. 1, the index of refraction decreases as the temperature at which the polysilicon is processed increases. The refractive index of polysilicon decreases from a value of over 4.8 as deposited at a deposition temperature of 525 degrees Celsius to a value of about 4.2 when it is subsequently annealed, at a temperature of about 600 degrees Celsius.

By comparison to these values, the value of the extinction coefficient of single-crystal silicon ("c-Si" as shown in FIG. 1) is about 0.05 and the refractive index of single-crystal silicon is between 4.1 and 4.2. These values represent limiting values of material properties that polysilicon approaches but does not reach when heated to higher temperatures.

Figures 2, 3:
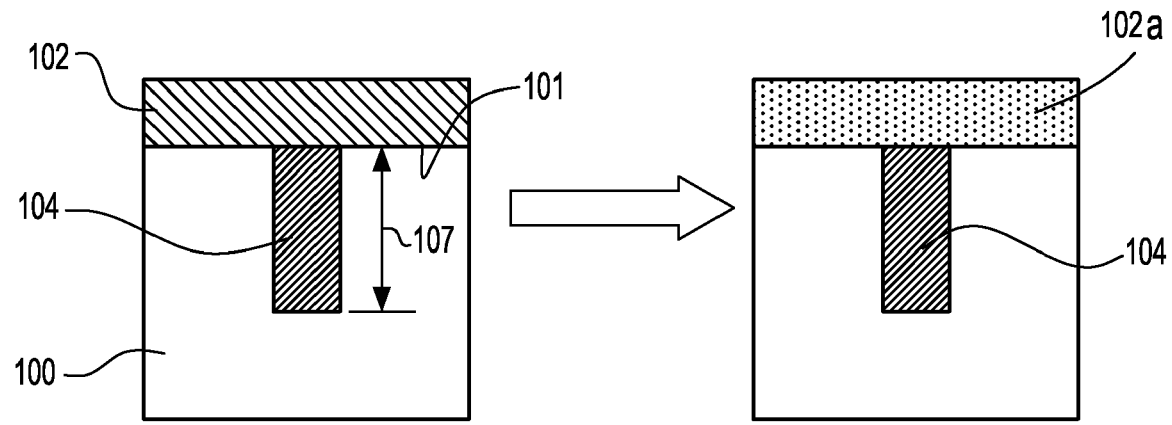
FIG. 2 is a sectional view illustrating a stage in a method of enhancing an optical property of a polysilicon layer in accordance with an embodiment of the invention.
FIG. 3 is a sectional view illustrating a stage subsequent to that shown in FIG. 2 in a method of enhancing an optical property of a polysilicon layer.

FIGS. 2 and 3 illustrate a process according to an embodiment of the invention for enhancing material characteristics of a polysilicon layer to be used as a hard mask. As illustrated in FIG. 2, a polysilicon layer 102 as initially deposited to overlie a substrate 100 at a temperature of less than about 550 degrees Celsius has an initially high extinction coefficient value. Therefore, the polysilicon layer 102 appears opaque and tends to block light from traveling through the layer 102 in a direction toward the substrate 100 and in a direction away from the substrate. The polysilicon layer 102 overlies an alignment feature 104 of the substrate. The alignment feature can be any regularly occurring pattern or periodic feature. Typically, alignment features extend from a surface 101 or a level below the surface of a substrate 100 to a depth 107. The alignment feature may take form of a filled trench etched into the substrate, for example. As described above, it is difficult to properly align a photolithographic exposure system to the substrate when alignment features of the substrate are obscured by a material which blocks a substantial amount of light used to capture images of alignment features of the substrate. As noted above with reference to FIG. 1, immediately after it is deposited the polysilicon layer has a high extinction coefficient and a relatively high refractive index.

Referring to FIG. 3, to address these deficiencies, post-deposition annealing is performed which reduces these unwanted properties of the polysilicon layer to levels which are manageable. After annealing, the polysilicon layer 102a hinders the transmission of light at wavelengths of an alignment signal much less than before. Specifically, through annealing, polysilicon layer 102a becomes substantially transmissive and/or transparent to wavelengths of light used for imaging alignment features of the substrate. In particular, the annealed polysilicon layer becomes substantially transmissive to light at 5320 angstroms, a common wavelength of light used for aligning photolithographic exposure tools to silicon substrates.

Preferably, the annealing step is performed at a temperature ranging from 550 to 1200 degrees Celsius. More preferably, the annealing temperature ranges from 580 to 1000 degrees Celsius, and most preferably, the annealing temperature ranges from 600 to 900 degrees Celsius. Depending on the annealing temperature, the annealing duration ranges from about 30 seconds to about 120 minutes. In a particular embodiment, the annealing step is performed in situ, that is, in the same equipment in which the polysilicon layer is deposited. In one embodiment, the polysilicon is deposited in a low-temperature chemical vapor deposition furnace at a temperature about 525 degrees Celsius and the annealing step is performed in the same furnace at a temperature about 600 degrees Celsius for about 30 minutes. Alternatively, the polysilicon layer can even be annealed by a "rapid thermal process" ("RTP") tool in which the temperature of the substrate is cycled rapidly from a moderate temperature such as 600 degrees Celsius to a target high annealing temperature such as a temperature of about 900 degrees Celsius for about 60 seconds.

Figure 4:
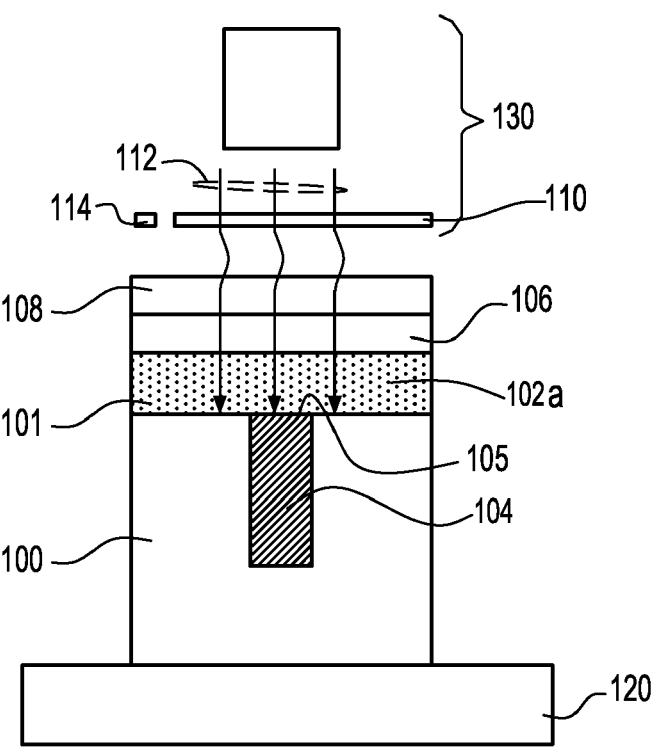
FIG. 4 is a sectional view illustrating a method in accordance with an embodiment of the invention for aligning a substrate having a polysilicon layer having an enhanced optical property thereon with a photolithographic exposure tool.

Referring to FIG. 4, following the annealing step, one or more photoimageable polymer layers is deposited to overlie the enhanced transmissivity polysilicon layer 102a of the substrate 100. In a particular embodiment, two photoimageable polymer layers are deposited, including a layer 106 of photoresist material and an antireflective coating ("ARC") 108. The antireflective coating 108 may either underlie or overlie the photoresist material 106. Alternatively, the photoimageable polymer layer includes a layer of photoresist 106 but not an ARC.

Subsequently, the substrate with the polysilicon layer and the one or more photoimageable layers is placed on a stage 120 to be aligned to a photolithographic exposure tool 130 for patterning the one or more photoimageable layers. To align the substrate with the photolithographic exposure tool a beam 112 of light is focused on a plane 101 of the substrate in which alignment features including alignment feature 104 has an exposed surface 105. Light from the beam 112 strikes the exposed surface 105 of the alignment feature and is reflected back towards a pickup device 114 of the photolithographic exposure tool as an alignment signal. The alignment signal received by the pickup device 114 is used to determine whether the substrate is properly aligned to the exposure tool 130. In a particular embodiment, the alignment signal received by the pickup device 114 is processed to determine what movement to impart to the stage 120 to bring the substrate 100 into alignment with the exposure tool 130. The enhanced transmissivity of the annealed polysilicon layer 102a and its reduced refractive index increase the signal quality of the alignment signal that returns from alignment features 104 of the substrate. In addition, with increased signal quality, steps to focus the alignment light onto the alignment features and to receive the alignment signal in return can become easier to perform.

After aligning the substrate 100 to the exposure tool 130, the aligned substrate 100 can now be patterned with the exposure tool. Patterning begins by the exposure tool 130 focusing light from an exposure source onto the one or more photoimageable layers 106, 108 to cast an image of a photomask 110 thereon. The exposed photoimageable layers are then developed into patterned layers which include areas that cover the polysilicon layer 102a and also include openings that exposure the polysilicon layer 102a. After these layers have been patterned, the areas of the polysilicon layer 102a exposed by the openings are now patterned. For example, the polysilicon layer 102a can be etched by an anisotropic vertical etch process such as a reactive ion beam ("RIE") etch process to form openings in the polysilicon layer which correspond to the photolithographically patterned openings in the photoresist and ARC layers. Subsequently, the thus patterned polysilicon layer can be used as a hard mask layer 102a for subsequent processing. In a particular embodiment, such hard mask layer 102a is used as a mask for a subsequent process to pattern other hard mask layer(s) such as silicon oxide and/or silicon nitride (not shown) in the substrate 100.

Thus, the embodiments of the invention described in the foregoing provide a way of enhancing the optical transmissivity of a polysilicon layer, such as a polysilicon layer which will be used as a hard mask layer after subsequent patterning. Enhanced transmissivity of the polysilicon layer benefits processes for obtaining an adequate alignment signal from an alignment feature within the substrate. With an improved alignment signal, results of procedures used to align the substrate with an exposure tool are improved.

While the invention has been described in accordance with certain preferred embodiments thereof, many modifications and enhancements can be made thereto without departing from the true scope and spirit of the invention, which is limited only by the claims appended below.

What is claimed is:

1. A method of forming a polysilicon layer on a substrate and aligning an exposure system with an alignment feature of the substrate through the polysilicon layer, comprising;
   depositing said polysilicon layer over said substrate including said alignment feature such that said polysilicon layer reaches a first temperature, said first temperature being about 525 degrees Celsius;
   annealing said polysilicon layer with said substrate to raise said polysilicon layer to a second temperature higher than said first temperature to thereby enhance at least one optical characteristic of said polysilicon layer and wherein said second temperature is greater than or equal to about 550 degrees Celsius;
   depositing a photoimageable layer over said enhanced polysilicon layer;
   receiving an alignment signal through said enhanced polysilicon layer from said alignment feature; and
   aligning an exposure system with said substrate using said alignment signal from said alignment feature.

2. A method as claimed in claim 1, wherein said step of annealing substantially increases transmission of said alignment signal through said polysilicon layer.

3. A method as claimed in claim 2, wherein said step of annealing decreases an extinction coefficient of said polysilicon layer.

4. A method as claimed in claim 3. wherein said extinction coefficient is reduced to a value of less than about 0.25.

5. A method as claimed in claim 3, wherein said step of annealing reduces an index of refraction of said polysilicon layer.

6. A method as claimed in claim 5. wherein said index of refraction is reduced to a value of less than about 4.4.

7. A method as claimed in claim 1, wherein said alignment signal includes a substantial signal component at a wavelength of about 5300 angstroms.

8. A method as claimed in claim 1, wherein said second temperature is greater than or equal to about 600 degrees Celsius. said polysilicon layer is raised to said second temperature rapidly.

9. A method as claimed in claim 8, further comprising:
   patterning said photoimageable layer with said aligned photolithographic exposure system to form a patterned first mask layer overlying said polysilicon layer;
   selectively removing portions of said polysilicon layer exposed by said patterned first mask layer to form a patterned polysilicon mask layer; and
   selectively processing areas of said substrate in accordance with said patterned second mask layer.

10. A method as claimed in claim 9, wherein said alignment signal includes a substantial signal component at a wavelength of about 5300 angstroms.

11. A method as claimed in claim 10, wherein said step of annealing reduces an extinction coefficient of said polysilicon layer to a value of less than or equal to about 0.25.

12. A method as claimed in claim 11, wherein said step of annealing reduces an index of refraction of said polysilicon layer to a value of less than about 4.4.

13. A method as claimed in claim 1, wherein said step of depositing said polysilicon layer is performed in a first processing chamber and said step of annealing is performed without moving said substrate from said first processing chamber.

14. A method as claimed in claim 1, wherein said step of annealing said substrate with said polysilicon layer is performed by rapid thermal processing ("RIP") such that said polysilicon layer is raised to said second temperature rapidly.

15. A method of processing a substrate, comprising:
   depositing a polysilicon layer over a substrate including an alignment feature such that said polysilicon layer reaches a first temperature of less than about 550 degrees Celsius;
   annealing said substrate with said polysilicon layer to raise said polysilicon layer to a second temperature greater than or equal to about 600 degrees Celsius and to decrease an extinction coefficient of said polysilicon layer to a value of less than or equal to about 0.25;
   depositing a photoimageable layer over said polysilicon layer;
   receiving an alignment signal including light from said alignment feature through said polysilicon layer, said alignment signal having a substantial signal component at a wavelength or about 5300 angstroms;

aligning a photolithographic exposure system with said substrate using said alignment signal from said alignment feature;

patterning said photoimageable layer with said aligned photolithographic exposure system to form a patterned first mask layer overlying said polysilicon layer;

selectively removing portions of said polysilicon layer exposed by said patterned first mask layer to form a patterned polysilicon mask layer; and selectively processing areas of said substrate in accordance with said patterned second mask layer.

\* \* \* \* \*